(12) United States Patent
Ohtani et al.

(10) Patent No.: US 7,993,992 B2
(45) Date of Patent: Aug. 9, 2011

(54) SEMICONDUCTOR DEVICE AND METHOD OF FABRICATING THE SAME

(75) Inventors: Hisashi Ohtani, Kanagawa (JP); Etsuko Fujimoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/615,309

(22) Filed: Nov. 10, 2009

(65) Prior Publication Data

US 2010/0055852 A1   Mar. 4, 2010

Related U.S. Application Data

(60) Continuation of application No. 11/750,389, filed on May 18, 2007, now Pat. No. 7,622,740, which is a continuation of application No. 11/033,279, filed on Jan. 12, 2005, now Pat. No. 7,223,666, which is a continuation of application No. 10/703,632, filed on Nov. 10, 2003, now Pat. No. 6,882,018, which is a division of application No. 08/958,568, filed on Oct. 28, 1997, now abandoned.

(30) Foreign Application Priority Data

Oct. 31, 1996   (JP) ...................................... 8-307443

(51) Int. Cl.
*H01L 21/84* (2006.01)

(52) U.S. Cl. ........ 438/151; 438/154; 438/157; 438/597; 438/655; 438/664

(58) Field of Classification Search .................. 438/151, 438/154, 157, 597, 655, 664
See application file for complete search history.

(56) References Cited

U.S. PATENT DOCUMENTS

| | | | |
|---|---|---|---|
| 4,672,419 A | 6/1987 | McDavid |
| 4,788,160 A | 11/1988 | Havemann |
| 4,804,636 A | 2/1989 | Groover, III |
| 4,851,363 A | 7/1989 | Troxell |
| 4,890,141 A | 12/1989 | Tang |
| 4,954,855 A | 9/1990 | Mimura |
| 5,001,082 A | 3/1991 | Goodwin-Johansson |
| 5,121,186 A | 6/1992 | Wong |
| 5,159,353 A | 10/1992 | Fasen |
| 5,187,122 A | 2/1993 | Bonis |
| 5,286,659 A | 2/1994 | Mitani |
| 5,313,076 A | 5/1994 | Yamazaki |
| 5,338,702 A | 8/1994 | Kobeda |
| 5,474,941 A | 12/1995 | Mitani |

(Continued)

FOREIGN PATENT DOCUMENTS

EP   0 493 113   7/1992

(Continued)

OTHER PUBLICATIONS

Office Action (Application No. 08-307443) with partial translation, Oct. 5, 2004, 7 pages.

*Primary Examiner* — Long Pham
(74) *Attorney, Agent, or Firm* — Fish & Richardson P.C.

(57) ABSTRACT

There is disclosed a method of fabricating TFTs having reduced interconnect resistance by having improved contacts to source/drain regions. A silicide layer is formed in intimate contact with the source/drain regions. The remaining metallization layer is selectively etched to form a contact pad or conductive interconnects.

30 Claims, 7 Drawing Sheets

U.S. PATENT DOCUMENTS

| | | | |
|---|---|---|---|
| 5,508,209 A | 4/1996 | Zhang | |
| 5,543,636 A | 8/1996 | Yamazaki | |
| 5,567,966 A | 10/1996 | Hwang | |
| 5,576,556 A | 11/1996 | Takemura | |
| 5,583,369 A | 12/1996 | Yamazaki | |
| 5,608,251 A | 3/1997 | Konuma et al. | |
| 5,620,905 A | 4/1997 | Konuma et al. | |
| 5,620,906 A | 4/1997 | Yamaguchi | |
| 5,623,157 A | 4/1997 | Miyazaki | |
| 5,644,147 A | 7/1997 | Yamazaki | |
| 5,659,194 A | 8/1997 | Iwamatsu | |
| 5,663,077 A | 9/1997 | Adachi et al. | |
| 5,691,561 A | 11/1997 | Goto | |
| 5,696,386 A | 12/1997 | Yamazaki | |
| 5,818,068 A | 10/1998 | Sasaki | |
| 5,946,561 A | 8/1999 | Yamazaki | |
| 5,962,897 A | 10/1999 | Takemura et al. | |
| 5,966,594 A | 10/1999 | Adachi et al. | |
| 6,049,092 A | 4/2000 | Konuma | |
| 6,051,494 A | 4/2000 | Iwamatsu | |
| 6,074,900 A | 6/2000 | Yamazaki | |
| 6,210,997 B1 | 4/2001 | Adachi et al. | |
| 6,271,066 B1 | 8/2001 | Yamazaki | |
| 6,335,555 B1 | 1/2002 | Takemura | |
| 6,355,512 B1 | 3/2002 | Yamazaki | |
| 6,448,612 B1 | 9/2002 | Miyazaki | |
| 6,455,875 B2 * | 9/2002 | Takemura et al. | 257/72 |
| 6,465,284 B1 | 10/2002 | Adachi et al. | |
| 6,512,296 B1 | 1/2003 | Gauthier, Jr. | |
| 6,562,672 B2 | 5/2003 | Yamazaki | |
| 6,624,443 B2 | 9/2003 | Tanabe | |
| 6,624,477 B1 | 9/2003 | Takemura et al. | |
| 6,649,976 B2 | 11/2003 | Iwamatsu | |
| 6,790,749 B2 | 9/2004 | Takemura et al. | |
| 6,964,890 B1 | 11/2005 | Yamazaki | |
| 7,109,108 B2 | 9/2006 | Takemura et al. | |
| 7,602,020 B2 | 10/2009 | Takemura et al. | |
| 7,723,788 B2 | 5/2010 | Takemura et al. | |
| 2010/0041187 A1 | 2/2010 | Takemura et al. | |

FOREIGN PATENT DOCUMENTS

| | | |
|---|---|---|
| EP | 0 519 692 | 12/1992 |
| EP | 0 613 177 | 8/1994 |
| EP | 0 650 197 A2 | 4/1995 |
| EP | 1 538 676 A2 | 6/2005 |
| JP | 63-258070 A | 10/1988 |
| JP | 05-055573 | 3/1993 |
| JP | 5-315355 A | 11/1993 |
| JP | 5315355 A | 11/1993 |
| JP | 06-061177 | 3/1994 |
| JP | 06-089905 | 3/1994 |
| JP | 06-244370 | 9/1994 |
| JP | 7-066426 A | 3/1995 |
| JP | 07-078782 A | 3/1995 |
| JP | 07-086606 A | 3/1995 |
| JP | 7-135323 A | 5/1995 |
| JP | 07-169974 | 7/1995 |
| JP | 07-169975 | 7/1995 |
| JP | 07-218932 | 8/1995 |
| JP | 07-231091 | 8/1995 |
| JP | 07-273346 | 10/1995 |
| JP | 07-283400 | 10/1995 |
| JP | 07-326768 | 12/1995 |

* cited by examiner

SEMICONDUCTOR DEVICE AND METHOD OF FABRICATING THE SAME

CROSS-REFERENCE TO RELATED APPLICATIONS

This application is a continuation of U.S. application Ser. No. 11/750,389, filed May 18, 2007, now allowed, which is a continuation of U.S. application Ser. No. 11/033,279, filed Jan. 12, 2005, now U.S. Pat. No. 7,223,666, which is a continuation of U.S. application Ser. No. 10/703,632, filed Nov. 10, 2003, now U.S. Pat. No. 6,882,018, which is a divisional of U.S. application Ser. No. 08/958,568, filed Oct. 28, 1997, now abandoned, which claims the benefit of a foreign priority application filed in Japan as Ser. No. 08-307443 on Oct. 31, 1996, all of which are incorporated by reference.

BACKGROUND OF THE INVENTION

1. Field of the Invention

The present invention relates to a TFT structure or a semiconductor integrated circuit construction having TFTs and to a method of fabricating such a structure. Especially, the invention relates to conductive interconnects for TFTs or for a semiconductor integrated circuit having TFTs Also, the invention relates to a method of forming such interconnects.

2. Description of the Related Art

Techniques for using TFTs (thin-film transistors) in an integrated circuit such as an active matrix liquid crystal display or image sensor fabricated on a glass substrate have been well known. Making reliable contacts of the semiconductor regions (such as source and drain) of the TFTs with conductive interconnects is important for such an integrated circuit. Also, decreasing the resistivity of the circuit is important. These requirements become more important and technical difficulties arise as the circuit device density increases.

The former requirement is associated with the fact that the used semiconductor thin film is quite thin. Generally, a semiconductor thin film is required to have good characteristics. However, it is quite difficult to form contacts on a semiconductor thin film as thin as hundreds of Angstroms. During fabrication of contact holes, overetching is highly likely to occur, forming holes or pits in the semiconductor holes. This phenomenon takes place, because the etch rates of silicon oxide and silicon nitride generally used as interlayer dielectrics and the etch rate of silicon (especially, in the case of dry etching) used as a semiconductor thin film are not very high.

With respect to the latter requirement, many resistors are made of thin films of semiconductors. Decreasing the semiconductor thin film portions of the circuit is a fruitful countermeasure. However, the problem cannot be solved simply by devising the circuit arrangement because of design rule problems.

A method for solving the latter problem has been proposed. This method consists of siliciding almost all portions corresponding to the source and drain of each TFT. An example of this proposed method is next described by referring to FIGS. 2(A)-2(F).

A semiconductor film, or an active layer, 22 is formed on a substrate 21. A gate insulator layer 23 is formed over this semiconductor film 22. Then, a gate electrode 24 and a gate interconnect 25 are formed on the insulator layer. The gate electrode 24 and the gate interconnect 25 are in the same layer. That is, they are fabricated at the same time. Doped regions such as a source 26 and a drain 27 are formed in the active layer 22 (FIG. 2(A)).

Thereafter, a sidewall dielectric 28 is deposited on the sidewalls of the gate electrode 24 and of the gate interconnect 25 by a well-known anisotropic etching technique. This is normally accomplished by coating the whole surface with an insulator and then performing anisotropic etching. At this time, the gate insulator layer 23 is also etched, exposing the surface of the active layer. A gate insulator film island 23a is formed under the gate electrode 24. Also, a gate insulator film island 23b is formed under the gate interconnect 25 (FIG. 2(B)).

Then, a metallization layer 29 is deposited over the whole surface (FIG. 2(C)). The metallization layer 29 and the active layer 22 are made to react with each other at their interface by thermal annealing, rapid thermal annealing, photo-annealing, or other means, thus obtaining a silicide layer, 30 and 31. The reaction may be made to progress to such an extent that the silicide layer reaches the bottom of the active layer as shown. Alternatively, the reaction may be stopped before the silicide layer reaches the bottom. In either case, the reaction starts from the interface between the metallization layer 29 and the active layer 22 and so the source and drain under the sidewall 28 remain semiconductive in nature (FIG. 2(D)).

Subsequently, the unreacted metallization layer portions are fully removed (FIG. 2(E)). Finally, a top layer of interconnect metal, 34 and 35, is formed on the interlayer dielectric 33 by a well-known, multi-level metallization technique. The top layer of interconnect metal forms contacts, 32a and 32b together with the silicide layer, 30 and 31. Also, the top layer of interconnect metal forms a contact 32c together with the gate interconnect 25.

In the example already described in conjunction with FIGS. 2(A)-2(E), anisotropically etched sidewalls are used. Techniques for anodizing gate electrodes, as disclosed in Japanese Patent Unexamined Publication Nos. 169974/1995, 169975/1995, and 218932/1995 may also be employed.

With this method, the resistivity of the circuit portions including TFTs can be reduced, because silicides have lower resistivities than semiconductor materials. However, the problems produced where contact holes are created can be hardly solved, because the etch rates of silicides and silicon oxide or silicon nitride are not sufficiently high where a dry etching method is used. It is known that the method of using an interlayer dielectric film of silicon nitride for TFTs is advantageous, as described in Japanese Patent Unexamined Publication No. 326768/1995. With this method, if the etch rates of silicon nitride and the active layer are not sufficiently high where the interlayer dielectric is etched, it is difficult to detect the end point of the etching, since the silicon nitride layer is approximately 10 times as thick as the active layer.

Other problems may arise, depending on circuits. For example, in the structure shown in FIGS. 2(A)-2(F), the drain 27 or silicide 31 must gain access to the gate interconnect 25 via the top layer of interconnect metal 35, i.e., via two contacts. Contacts tend to produce many defects and have large resistivities. Obviously, the number of the contacts included in the circuit should be reduced to a minimum. Furthermore, the silicide layer is very thin, producing many defects at the contacts, though the possibility of overetching decreases. Consequently, the contact holes are required to have sufficient spread, which is an obstacle in achieving higher circuit density.

SUMMARY OF THE INVENTION

The present invention resides in a semiconductor device comprising a gate electrode, a gate insulator film wider than the gate electrode, an active layer, a pair of n- or p-type doped regions formed in the active layer, a pair of silicide layers self-aligned to the gate insulator film, and a selectively grown metallization layer in intimate contact with the silicide layers. The metallization layer is made of a metallic element. The silicide layers each mainly consist of this metallic element and silicon. (Invention 1)

In one embodiment, a top layer of interconnect metal is formed on the gate electrode. This top layer of interconnect metal may be connected with the metallization layer via at least one contact. This structure corresponds to Invention 2. For example, it can be a contact between the top layer of interconnect metal and the source or drain of each TFT (silicide layer). This structure is effective in preventing defective contacts between the quite thin silicide layer described in connection with FIGS. 2(A)-2(F) and the top layer of interconnect metal.

The active layer of the TFT needs to be quite thin because of the required characteristics. However, the present invention does not demand that the metallization layer be made quite thin, because the metallization layer in accordance with the present invention is intended to form a silicide layer in the active layer. Rather, the metallization layer may be made sufficiently thick. In the present invention, the whole silicide layer forming the source and drain is in contact with the metallization layer, forming an alloy. The metallization layer is in contact with the top layer of interconnect metal. The concentration of defects of the former is very low. Also, the concentration of defects of the latter is much lower than that of the structure of FIGS. 2(A)-2(F), because the metallization layer is sufficiently thick. Accordingly, the total concentration of defects is greatly reduced.

In the fundamental structure described above, the gate interconnect lying in the same layer as the gate electrode may have at least one contact with the metallization layer coupled to the silicide layer. This structure corresponds to Invention 3 and permits the drain 27 (silicide layer 31) shown in FIGS. 2(A)-2(F) and the gate interconnect 25 to be connected without the need to form contact holes.

Generally, the gate layer forming the gate electrode and gate interconnect is isolated from the metallization layer forming the source and drain by an interlayer dielectric. Therefore, contact holes have been always required to make contacts between these two layers. Obviously, the freedom from the contact holes is advantageous to the circuit arrangement.

The metallization layer is used directly as conductive interconnects as mentioned above. Since the resistivity of the metal forming the silicide is higher than that of the interconnect metal by at least one order of magnitude, a layer of another metal having a lower resistivity may be formed on the metallization layer to lower the resistivity of the conductive interconnects. This structure corresponds to Invention 4. The metallization layer may consist chiefly of a material selected from the group consisting of titanium, molybdenum, tungsten, platinum, chromium, and cobalt.

Preferably, the semiconductor device of the construction described above is fabricated by the following process sequence: (1) A gate insulator layer and a gate electrode are formed on an active layer; (2) The gate insulator layer is etched to form a gate insulator film wider than the gate electrode; (3) A metallization layer in intimate contact with the active layer is formed; (4) The active layer is reacted with the metallization layer to form a silicide layer self-aligned to the gate insulator film; and (5) the metallization layer is selectively etched.

The construction of Invention 4 described above may be fabricated by performing a step of forming a layer of a second metal having a resistivity lower than that of the material of the metallization layer. This layer of the second metal is in intimate contact with the metallization layer. This process step is performed between the steps (3) and (5) above. Where a nonrefractory metal such as aluminum is used, it is better to avoid the execution of the step (4) involving a high temperature. Therefore, this step of forming the second metal layer may be carried out between the processing steps (4) and (5) above.

While the process steps (1)-(5) have been described, fabrication of the source and drain, or doped regions, have not been described in detail. Generally, it is desired to form these doped regions prior to the step (3). In the present invention, the doped regions may or may not be self-aligned to the gate electrode. Where the doped regions are self-aligned to the gate electrode, the following two procedures are conceivable. Most commonly, the step of forming the doped regions is carried out between the steps (1) and (2). This is effective where the sidewalls are used as illustrated in FIGS. 2(A)-2(F).

A fabrication step of forming a more heavily doped region may be performed between the steps (2) and (3). This heavily doped region is of the same conductivity type as the doped regions formed by the above-described process steps. Thus, a double-implant lightly doped drain (DI-LDD) structure can be obtained. This step may be carried out after the step (3). In this case, the implants may not be done up to a desired depth, depending on the thickness of the metallization layer. If this step is performed after the step (5), implants can be carried out into other than the double-implant lightly doped drain structure without difficulty.

Where anodization of the gate electrode is utilized, the formation of the doped region is executed between the processing steps (2) and (3). If the gate interconnect is also exposed during the step (2), the metallization layer forms a junction with the gate interconnect. Therefore, the construction of Invention 3 can be obtained by appropriate selective etching.

After the fundamental steps (1)-(5) described thus far, well-known multi-layer metallization steps may be added. That is, the following three steps are added: (6) An interlayer dielectric is deposited; (7) The interlayer dielectric is etched to form contact holes reaching the metallization layer; and (8) A top layer of interconnect metal in contact with the metallization layer via the contact holes is formed. In this way, the construction of Invention 2 can be derived.

Other objects and features of the invention will appear in the course of the description thereof, which follows.

DESCRIPTION OF THE PREFERRED EMBODIMENTS

Embodiment 1

Figure 1:
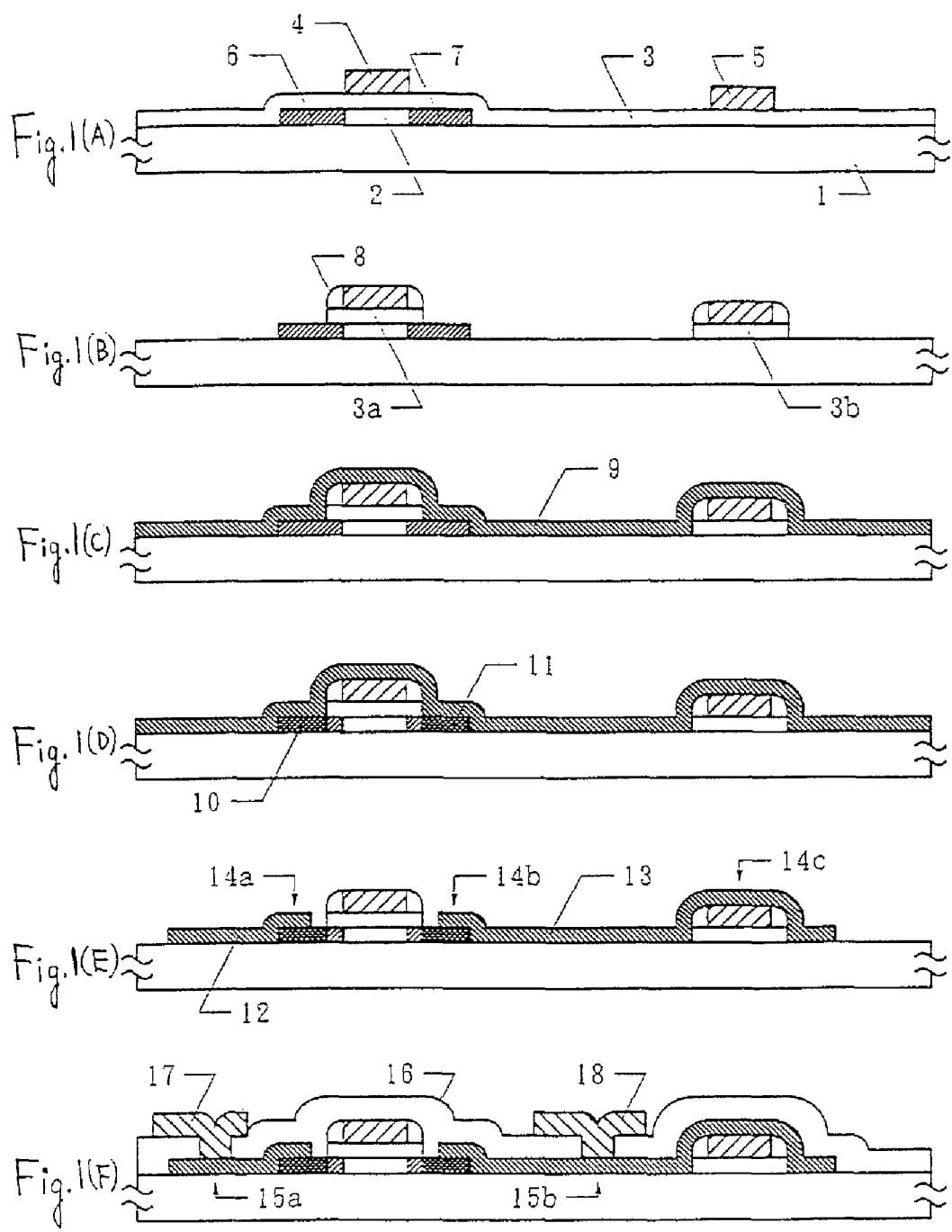
FIGS. 1(A)-1(F) are cross-sectional views illustrating a process sequence for fabricating a semiconductor circuit in accordance with Embodiment 1 of the present invention.
Figure 2:
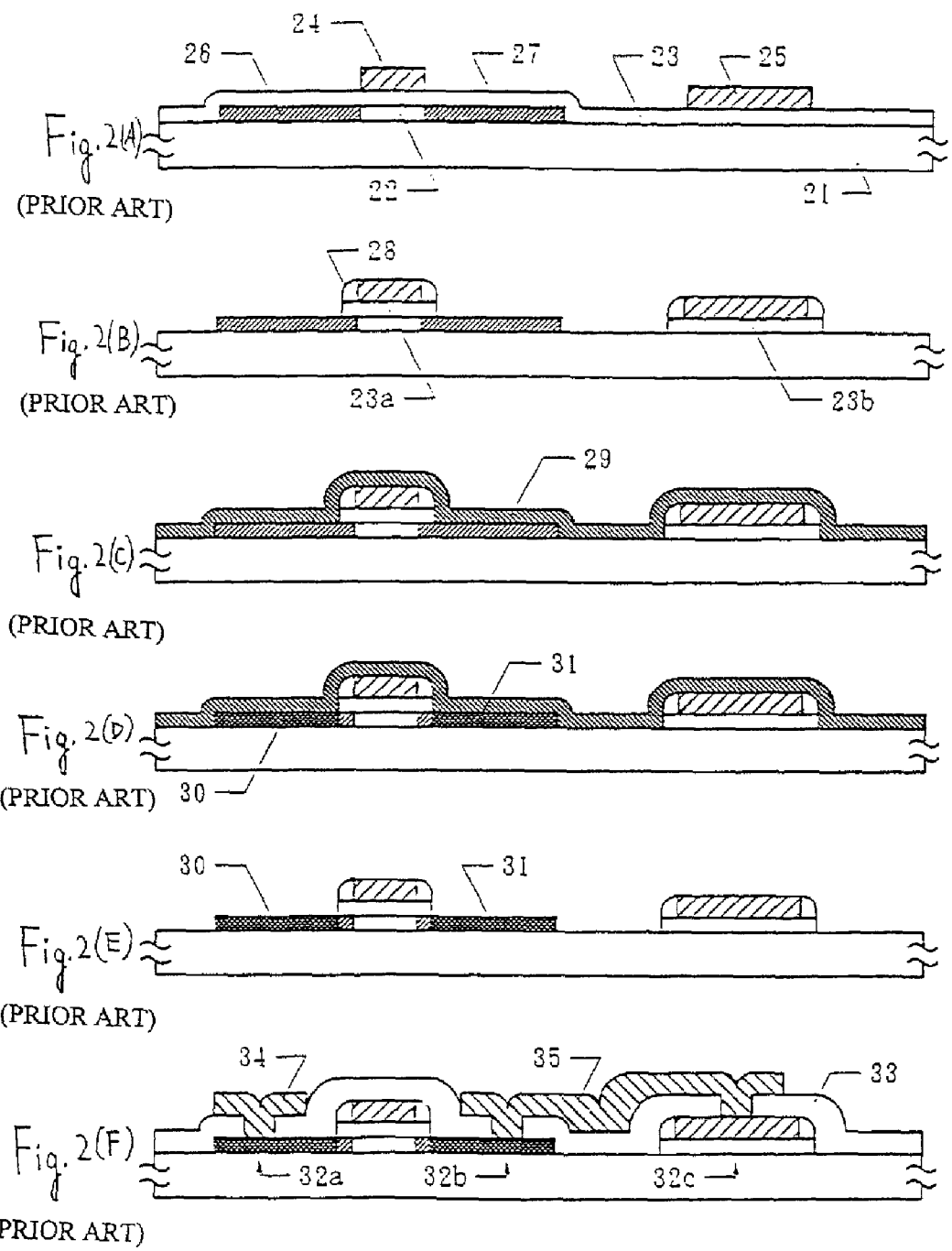
FIGS. 2(A)-2(F) are cross-sectional views illustrating the prior art TFT structure.

FIGS. 1(A)-1(F) schematically illustrate a process sequence for fabricating TFTs in accordance with the present embodiment. Although these are n-channel TFTs, it is obvious that p-channel TFTs can be manufactured also by forming the source/drain regions out of a p-type semiconductor. The TFTs in accordance with the present embodiment can be disposed at pixels of liquid crystal displays, used in peripheral circuits, in image sensors, and in other integrated circuits.

In the present embodiment, a substrate 1 is made of a glass substrate coated with a silicon oxide film (not shown) having a thickness of 2000 Å. The coating can be made by sputtering or plasma-assisted CVD (PCVD). Then, an amorphous silicon film is formed to a thickness of 500 Å by PCVD. The method of forming this amorphous silicon film and its film thickness are determined according to the manner in which the present invention is practiced, and no limitations are imposed on them. Also, a crystalline silicon film (e.g., a film of silicon of crystallites or polysilicon) can be exploited.

Then, the amorphous silicon film is crystallized to obtain a crystalline silicon film. Generally, this crystallization is performed by heating at 550-700° C. for 1-48 hours. Instead, irradiation of laser light or other intense light may be used. The silicon film crystallized in this way is etched into islands for device isolation, thus defining an active layer region 2. In this active layer region 2, source/drain regions and a channel region will be formed.

Thereafter, a silicon oxide film 3 becoming a gate insulator film is formed to a thickness of 1200 Å. The silicon oxide film 3 is formed by sputtering or PCVD using an organic silane (e.g., TEOS) and oxygen. Then, a polycrystalline phosphorus-doped silicon film becoming gate electrodes is grown to a thickness of 6000-8000 Å (in the present embodiment, 6000 Å). The gate electrodes may be made of a metal silicide and a silicon-metal lamination, as well as silicon.

Subsequently, the polysilicon film is patterned to form gate electrodes 4 and gate interconnects 5. Phosphorus (P) ions that are dopants for imparting the n-type conductivity are implanted into the active layer 2 by an ion implantation method. At this time, the gate electrodes 4 act as a mask, and source/drain regions 6 and 7 are formed in a self-aligned manner (FIG. 1(A)).

Then, annealing making use of laser illumination is done to activate the implanted P ions and to heal the crystallinity of the silicon film deteriorated. This annealing can be lamp annealing employing infrared radiation. In the annealing using infrared radiation (e.g., infrared radiation of 1.2 μm), the infrared radiation is selectively absorbed by the silicon semiconductor. The glass substrate is not heated so much. Furthermore, the heating of the glass substrate can be suppressed by setting the period of each shot of illumination short. In this way, this method is quite useful.

Thereafter, a silicon oxide film is formed to a thickness of 6000 Å to 2 μm (9000 Å, in this embodiment) either by sputtering or by PCVD using TEOS and oxygen. This silicon oxide film is etched by anisotropic dry etching making use of a well-known RIE (reactive ion etching) method. With respect to the sidewalls of the gate electrodes 4 having a height of 9000 Å, the height of silicon oxide is about twice the film thickness of 9000 Å. Therefore, if the etching is made to proceed, almost triangular sidewalls 8 of silicon oxide can be left behind.

In the present embodiment, the width of the triangular sidewalls 8 of the silicon oxide is approximately 3000 Å. This value may be determined, taking account of the thickness of the silicon oxide film, the etching conditions, and the height of the gate electrodes 4. During this process, the gate insulator film is also etched, exposing the source 6 and the drain 7. Furthermore, the top surfaces of the gate electrode 4 and of the gate interconnects 5 are exposed.

The silicon oxide film is left under the gate electrode 4, under the gate interconnects 5, and under their sidewalls. Since the remaining film is somewhat different from the gate insulator "layer" 3 described above, it is referred to as a gate insulator "film". That is, a gate insulator film 3a is formed under the gate electrode 4 and under its sidewalls. A gate insulator film 3b is obtained under the gate interconnects 5 and under their sidewalls (FIG. 1(B)). Then, a film of Ti (titanium) 9 is formed over the whole surface to a thickness of 3000 to 6000 Å by sputtering (FIG. 1(C)).

The Ti is reacted with the active layer of silicon by thermal annealing to form a silicide. In the present embodiment, the annealing is done at 550 to 600° C. to form silicide layer portions 10 and 11 on the source 6 and the drain 7, respectively. It is to be noted that in the present embodiment, silicon is used as the material of the gate interconnects/electrodes. Therefore, the reaction producing the silicide progresses at these portions, which is effective in reducing the resistivities of gate interconnects/electrodes but does not adversely affect other characteristics.

This annealing may be lamp annealing using infrared radiation. Where lamp annealing is utilized, the lamp irradiation is done such that the temperature of the surface of the illuminated surface reaches about 600-1000° C. Where the temperature is 600° C., the lamp irradiation is performed for several minutes. Where the temperature is 1000° C., the lamp irradiation is continued for several seconds. In this embodiment, the thermal annealing is conducted at 450° C. after the formation of the Ti film. Depending on the heat resistance of the substrate, the temperature may be above 500° C. (FIG. 1(D)).

Figure 6:
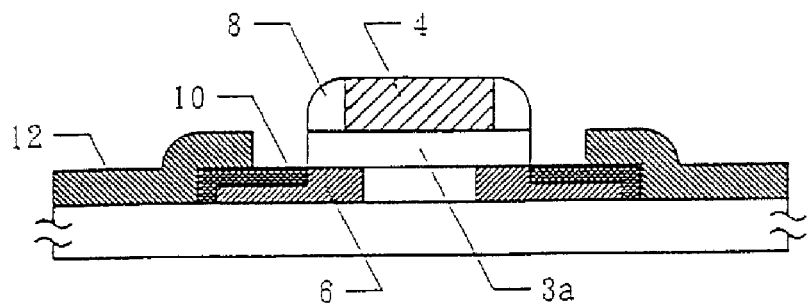
FIG. 6 is an enlarged cross section of a TFT in accordance with Embodiment 1, conceptually illustrating the structure of the TFT.

In the illustrated embodiment, the silicide layer, 10 and 11, is shown to reach the bottom of the active layer. The reaction may be interrupted before the silicide layer arrives at the bottom of the active layer as shown in FIG. 6. No essential difference is produced between these two different methods (FIG. 6).

Then, the Ti film is selectively etched by a well-known photolithography method, using an etchant consisting of a mixture of hydrogen peroxide, ammonia, and water at a ratio of 5:2:2. As a result of the above-described process step, a Ti film (titanium interconnect) 12 connected with the source 6 (silicide 10) via a contact 14a is obtained. Also, a Ti film (titanium interconnect 13) connected with the drain 7 (silicide 11) via a contact 14b is derived. The Ti film 13 is connected with the gate interconnect 5 via a contact 14c (FIG. 1(E)).

Subsequently, an interlayer dielectric 16 is deposited by plasma-assisted CVD (PCVD). Preferably, the dielectric 16 is silicon nitride or silicon oxide. Contact holes 15a and 15b are formed in the dielectric layer. An interconnect metal is deposited by sputtering, and the resulting film is etched to form a top layer of interconnect metal, 17 and 18. Aluminum may be used directly as the interconnect metal, for the following reason. In the present embodiment, the contacts are made of Ti and so the contacts are less deteriorated by the alloying reaction. This is an advantage over the prior art structure illustrated in FIGS. 2(A)-2(F) (FIG. 1(F)).

A circuit including the n-channel TFT completed in this way is substantially the same as the circuit constructed as illustrated in FIGS. 2(A)-2(F). In the present invention, however, an additional photolithography step is necessary to selectively etch the Ti film. Nonetheless, the number of the contact holes can be reduced by one in the present embodiment. The interconnect resistance of the present embodiment will make no great difference unless the distance between the drain 7 and the gate interconnect 5 is large.

The present embodiment is further characterized in that the area of the active layer can be reduced. In the structure shown in FIGS. 2(A)-2(F), the contacts between the source/drain and the top layer of interconnect metal are formed over the active layer. In contrast, such a limitation is not imposed on the present embodiment. Also, in the structure shown in FIGS. 2(A)-2(F), the contact holes are necessary in creating the contacts to the gate interconnect and, therefore, the gate interconnect 25 needs a large area at the contact portion. In the present embodiment, no contact holes are necessary between the Ti film 13 and the gate interconnect 5 and so only a small area suffices. This is advantageous for circuit arrangement.

Embodiment 2

FIGS. 3(A)-3(F) schematically illustrate a process sequence for fabricating TFTs in accordance with the present invention. What are fabricated in the present embodiment are n-channel TFTs, but it is obvious that p-channel TFTs can be manufactured by forming the source/drain regions out of a p-type semiconductor. The TFTs in accordance with the present embodiment can be disposed at pixels of liquid crystal displays, used in peripheral circuits, in image sensors, and in other integrated circuits.

In the present embodiment, a substrate 41 is made of a glass substrate coated with a silicon oxide film (not shown) having a thickness of 2000 Å. Islands of a crystalline silicon film (active layer) 42 are formed on the substrate. A silicon oxide film 43 becoming a gate insulator layer is formed to a thickness of 1200 Å over the crystalline silicon film. Then, a gate electrode 44 and a gate interconnect 45 are formed out of a polycrystalline phosphorus-doped silicon film. Phosphorus ions are implanted as dopants into the active layer 42 to impart the n-type conductivity. During this process step, the gate electrode 44 acts as a mask. Thus, source/drain regions 46 and 47 are formed in a self-aligned manner (FIG. 3(A)).

In the same way as in Embodiment 1, sidewalls 48 are formed on the sidewalls of the gate electrode/interconnect. During this process, the gate insulator layer is also etched, exposing the source 46 and the drain 47. Furthermore, the top surfaces of the gate electrode 44 and of the gate interconnects 45 are exposed. A gate insulator film, 43a and 43b, is formed under the gate electrode 44, under the gate interconnect 45, and under their sidewalls (FIG. 3(B)).

Then, a Ti (titanium) film is formed. In this embodiment, the Ti film, 49, is formed by sputtering over the whole surface to a thickness of 500 to 1000 Å that is thinner than in Embodiment 1 (FIG. 3(C)).

Figure 3:
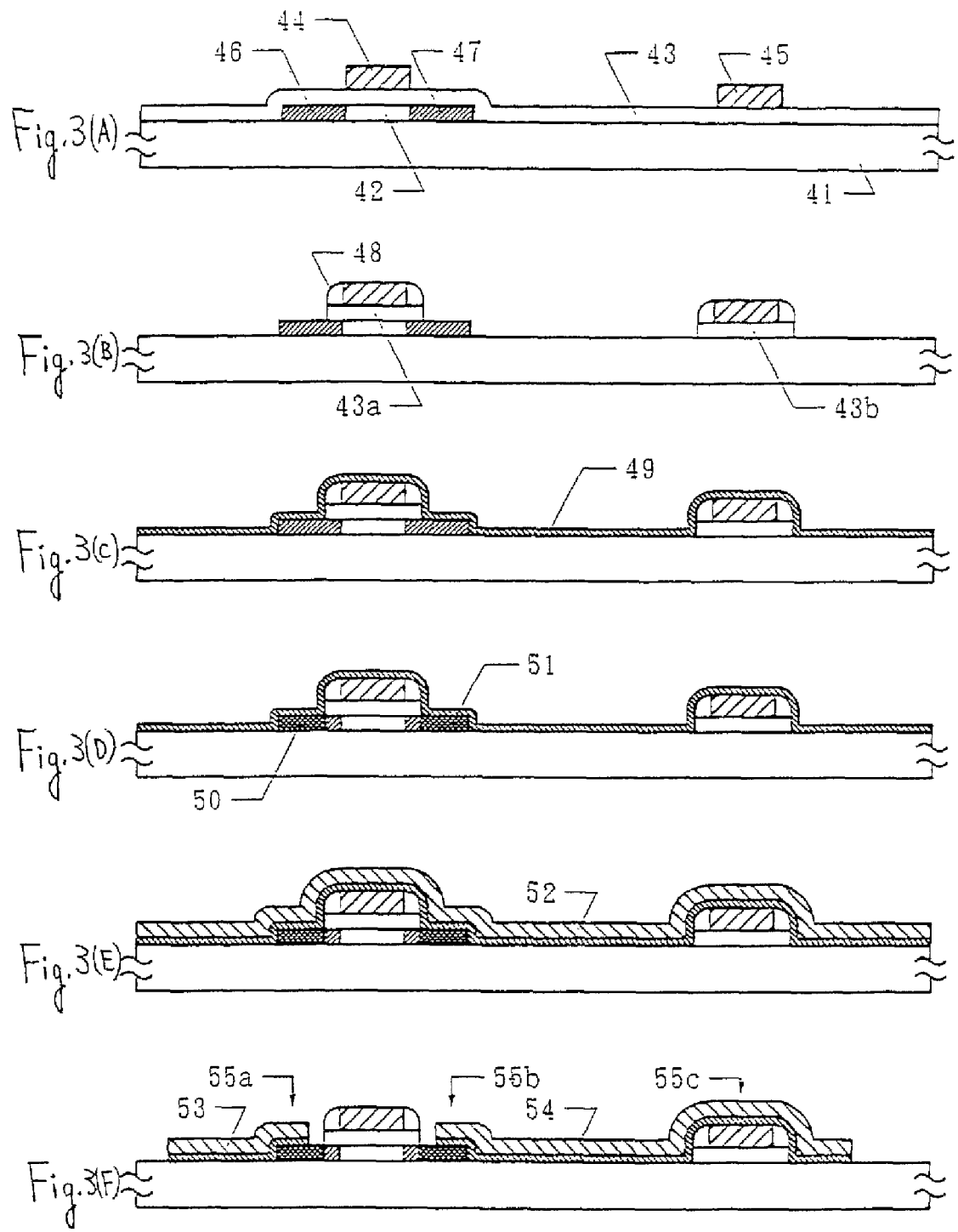
FIGS. 3(A)-3(F) are cross-sectional views illustrating a process sequence for fabricating a semiconductor circuit in accordance with Embodiment 2 of the present invention.

The Ti layer is reacted with the active layer of silicon by thermal annealing to form a silicide layer, 50 and 51, a source 46, and a drain 47 (FIG. 3(D)). Subsequently, an aluminum film 52 having a thickness of 6000-10000 Å is deposited over the whole surface by sputtering (FIG. 3(E)).

Then, the aluminum film and the Ti film are selectively etched. During the etching of the Ti, the previously etched aluminum film is used as a mask. If both aluminum and Ti are processed by wet etching, the aluminum is first etched and then the Ti is etched. Subsequently, the aluminum is again etched to etch the side surfaces of the aluminum. In consequence, smoother etch steps can be obtained.

As a result of the above-described process steps, a conductive interconnect 53 connected with the source 46 (silicide 50) via a contact 55a is created. Also, a conductive interconnect 54 connected with the drain 47 (silicide 51) via a contact 55b is formed. The interconnect 54 is also connected with a gate interconnect 45 via a contact 55c. In the present embodiment, the interconnect 54 is a Ti—Al multilayer film and has a lower resistivity than that of Embodiment 1. Therefore, if the distance between the drain 47 and the gate interconnect 45 is great, no problem takes place (FIG. 3(F)). A top layer of interconnect metal may be formed by multilayer metallization techniques, in the same way as in Embodiment 1.

Embodiment 3

FIGS. 4(A)-4(F) schematically illustrate a process sequence for fabricating TFTs in accordance with the present embodiment. In this embodiment, a substrate 61 is made of a glass substrate coated with a silicon oxide film (not shown) having a thickness of 2000 Å. Islands of a crystalline silicon film (active layer) 62 are formed on the substrate. A silicon oxide film 63 becoming a gate insulator layer is formed to a thickness of 1200 Å over the crystalline silicon film. Then, a gate electrode 64 and a gate interconnect 65 are formed out of a polycrystalline phosphorus-doped silicon film. Phosphorus ions are implanted as dopants into the active layer 62 to impart the n-type conductivity. During this process step, the gate electrode 64 acts as a mask, and doped regions 66 and 67 are formed in a self-aligned manner but with a low dopant concentration of $1 \times 10^{17}$ to $10^{19}$ atoms/cm$^3$ (FIG. 4(A)).

In the same way as in Embodiment 1, sidewalls 68 are formed on the sidewalls of the gate electrode/interconnect. During this process, the gate insulator layer is also etched, exposing the source 66 and the drain 67. Furthermore, the top surfaces of the gate electrode 64 and of the gate interconnects 65 are exposed. A gate insulator film, 63a and 63b, is formed under the gate electrode 64, under the gate interconnect 65, and under their sidewalls.

Then, phosphorus ions are again implanted as dopants by an ion implantation method to a high dopant concentration of $2 \times 10^{19}$ to $5 \times 10^{21}$ atoms/cm$^3$. In this way, a source 69 and a drain 70 are formed (FIG. 4(B)). Then, a film of Ti (titanium) 71 is formed over the whole surface to a thickness of 3000 to 6000 Å by sputtering (FIG. 4(C)).

Figure 4:
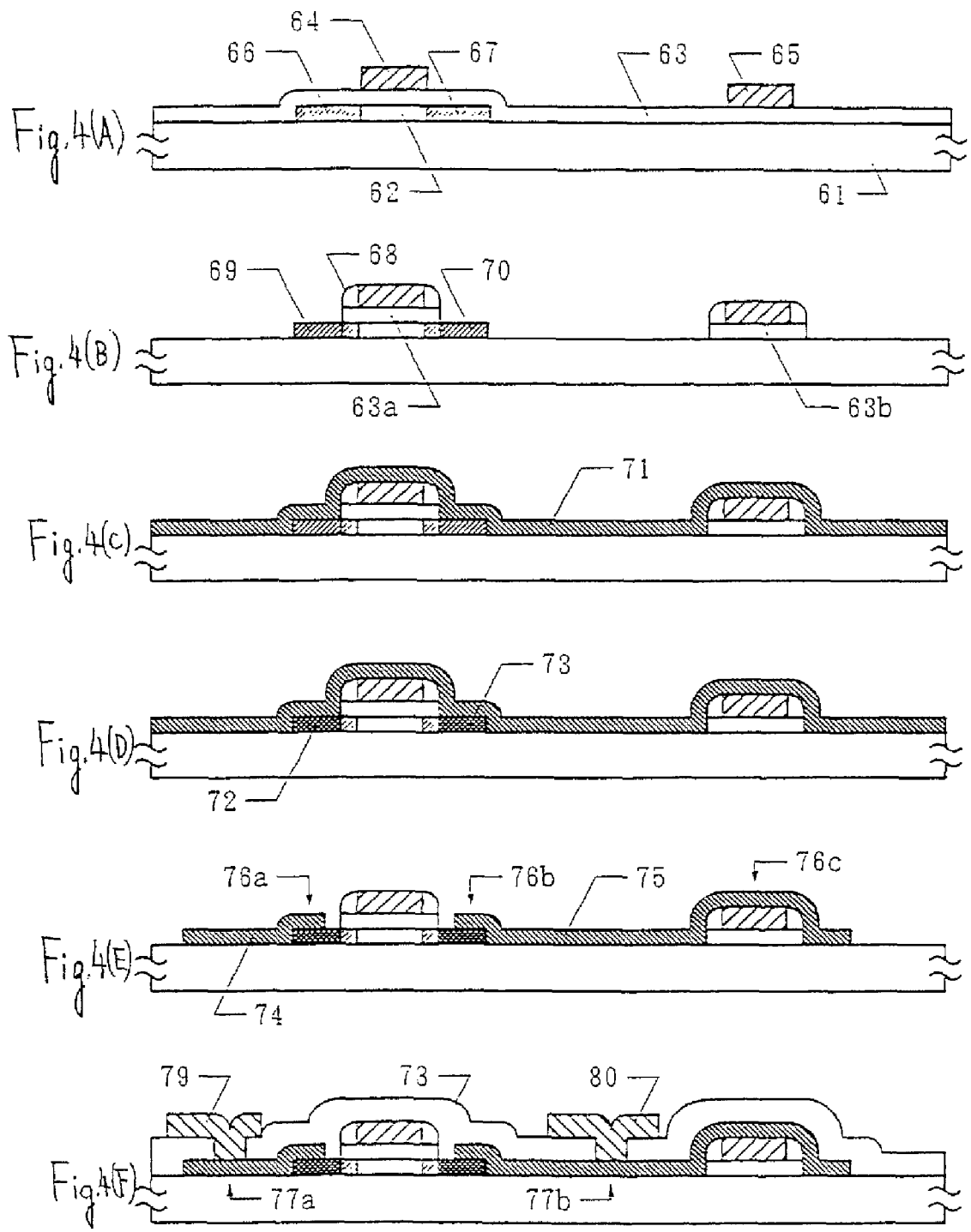
FIGS. 4(A)-4(F) are cross-sectional views illustrating a process sequence for fabricating a semiconductor circuit in accordance with Embodiment 3 of the present invention.
Figure 5:
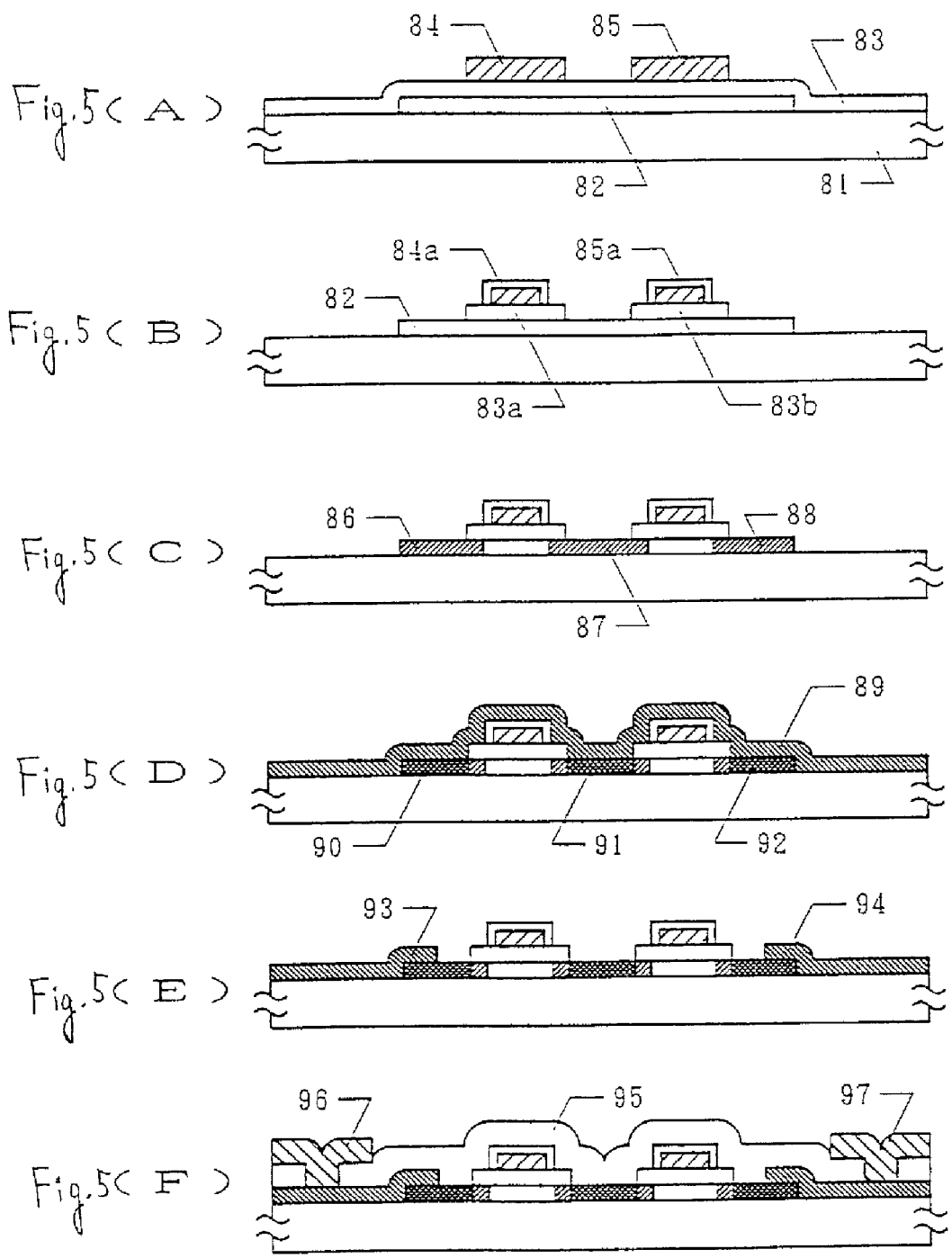
FIGS. 5(A)-5(F) are cross-sectional views illustrating a process sequence for fabricating a semiconductor circuit in accordance with Embodiment 4 of the present invention.

The Ti layer is reacted with the active layer of silicon by thermal annealing to form a silicide layer, 72 and 73, on a source 69 and on a drain 70 (FIG. 4(D)). Then, the Ti film is selectively etched under the same conditions as in Embodiment 1. As a result of the above-described process steps, a conductive interconnect 74 connected with a source 69 (silicide 72) via a contact 76a is created. Also, a conductive interconnect 75 connected with a drain 70 (silicide 73) via a contact 76b is formed. The interconnect 75 is also connected with a gate interconnect 65 via a contact 76c (FIG. 4(E)).

An interlayer dielectric 78 is deposited by a multilayer metallization technique, in the same manner as in Embodiment 1. Contact holes 77a and 77b are created in this dielectric layer, and conductive interconnects 79 and 80 are formed (FIG. 4(F)).

Figure 7:
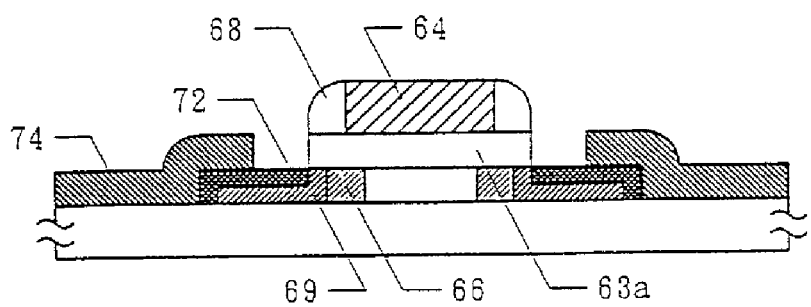
FIG. 7 is an enlarged cross section of a TFT in accordance with Embodiment 3, conceptually illustrating the structure of the TFT.

In the present embodiment, the silicide layer, 72 and 73, may not reach the bottom of the active layer as shown in FIG. 7. A source 69, or a heavily doped region, is left between the lightly doped n-type region 66 and the silicide layer 72 as shown in FIG. 7, which is not seen from FIGS. 4(A)-4(F). A similar situation occurs near the drain. This structure is effective in reducing the electric field strength near the source and drain (FIG. 7).

Embodiment 4

FIGS. 5(A)-5(F) schematically illustrate a process sequence for fabricating TFTs in accordance with the present embodiment. In this embodiment, a substrate 81 is made of a glass substrate coated with a silicon oxide film (not shown) having a thickness of 2000 Å. Islands of a crystalline silicon film (active layer) 82 are formed on the substrate. A silicon oxide film 83 becoming a gate insulator layer is formed to a thickness of 1200 Å over the crystalline silicon film. Then, gate electrodes 84 and 85 are formed from an aluminum film (FIG. 5(A)).

Subsequently, the gate electrodes and the gate insulator layer are processed, using the anodization techniques disclosed in the above-cited Japanese Patent Unexamined Publication Nos. 169974/1995, 169975/1995, and 218932/1995, thus producing the illustrated structure. The gate electrodes are coated with a barrier-type anodic oxide. In this manner, gate electrodes 84a, 85a and a gate insulator film, 83a and 83b, are obtained FIG. 5(B)).

Then, phosphorus ions are implanted as dopants into the active layer 82 to impart the n-type conductivity. During this process step, the gate electrodes 84a and 85a serve as a mask, and doped regions 86, 87, and 88 are formed in a self-aligned manner (FIG. 5(C)).

Then, a film of Ti (titanium) 89 is formed over the whole surface to a thickness of 3000 to 6000 Å by sputtering. The Ti layer is reacted with the active layer of silicon by thermal annealing to form a silicide layer, 90-92, in the doped regions 86-88 (FIG. 5(D)).

Thereafter, the Ti film is selectively etched under the same conditions as in Embodiment 1. As a result of the above-described process steps, conductive interconnects 93 and 94 are produced (FIG. 5(E)). Then, an interlayer dielectric 95 is deposited by a multilayer metallization technique, in the same manner as in Embodiment 1. Contact holes are created in this dielectric, and conductive interconnects 96 and 97 are formed (FIG. 5(F)).

Embodiment 5

Figure 8:
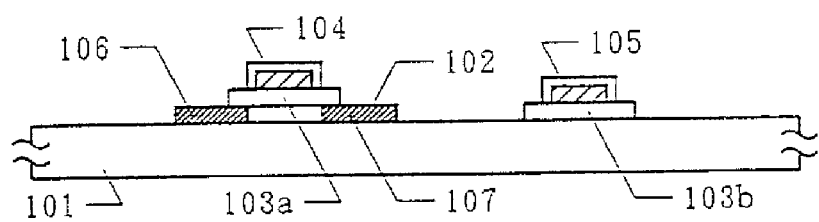
FIGS. 8(A)-8(C) are cross-sectional views illustrating a process sequence for fabricating a semiconductor circuit in accordance with Embodiment 5 of the invention.
Figure 8:
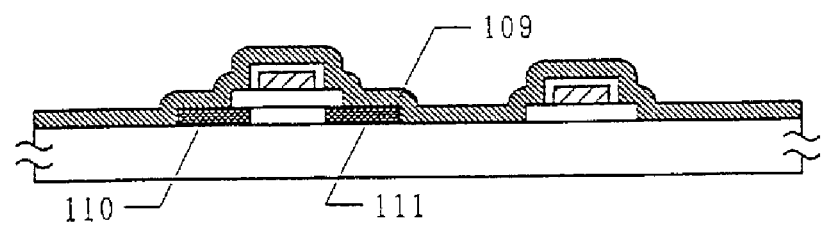
Figure 8:
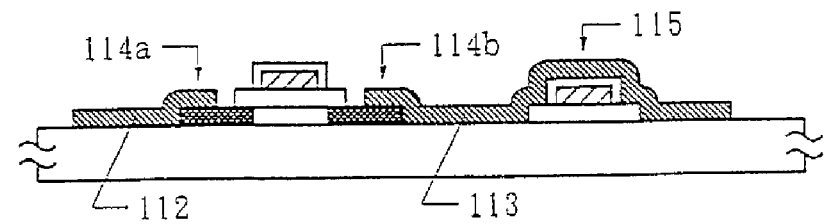

FIGS. 8(A)-8(C) schematically illustrate a process sequence for fabricating TFTs in accordance with the present embodiment. In this embodiment, a substrate 101 is made of a glass substrate coated with a silicon oxide film (not shown) having a thickness of 2000 Å. Islands of a crystalline silicon film (active layer) 102 having a source 106 and a drain 107, a gate insulator film 103a, and a gate electrode 104 are formed on the substrate, using the technique described in Embodiment 4. At the same time, gate interconnects 105 having a gate insulator film 103b are formed (FIG. 8(A)).

Then, a film of Ti (titanium) 109 is formed over the whole surface to a thickness of 3000 to 6000 Å by sputtering. The Ti layer is reacted with the active layer of silicon by thermal annealing to form a silicide layer, 110-111, in the source 106 and in the drain 107 (FIG. 8(B)).

Thereafter, the Ti film is selectively etched under the same conditions as in Embodiment 1. As a result of the above-described process steps, a conductive interconnect 112 connected with the source 106 (silicide 110) via a contact 114a is obtained. Also, a conductive interconnect 113 connected with the drain 107 (silicide 111) via a contact 114b is produced. The interconnect 113 overlaps the gate interconnect 105 but no junction is formed because the gate interconnect 105 is coated with a barrier-type, highly insulating anodic oxide. However, this portion 115 is effectively used as a capacitance. This capacitance is used as an auxiliary capacitance in an active matrix liquid crystal display (FIG. 8(C)).

Embodiment 6

FIGS. 9(A)-9(E) schematically illustrate a process sequence for fabricating TFTs in accordance with the present embodiment. In this embodiment, a substrate 121 is made of a glass substrate coated with a silicon oxide film (not shown) having a thickness of 2000 Å. Islands of a crystalline silicon film (active layer) 122 are formed on the substrate. A silicon oxide film 123 becoming a gate insulator layer is formed to a thickness of 1200 Å over the crystalline silicon film. Then, gate electrodes 124 and 125 are formed out of an aluminum film. Phosphorus ions are implanted as dopants into the active layer 122 to impart the n-type conductivity. During this process step, the gate electrodes 124 and 125 act as a mask, and doped regions 126, 127, and 128 are formed in a self-aligned manner but with a low dopant concentration of $1\times10^{17}$ to $10^{19}$ atoms/cm$^3$ (FIG. 9(A)).

Then, the gate insulator layer 123 is etched by a well-known photolithography method to expose the doped regions 126-128 partially as shown. In this manner, a gate insulator film, 123a and 123b, is obtained.

Figure 9:
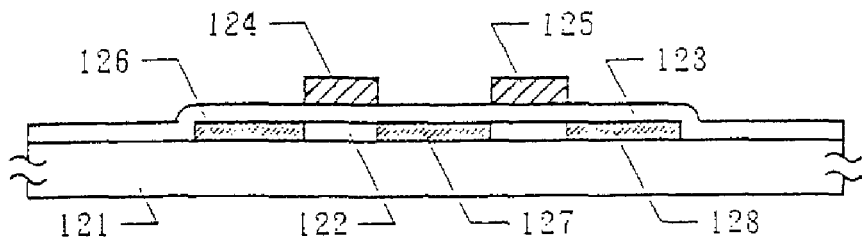
FIGS. 9(A)-9(E) are cross-sectional views illustrating a process sequence for fabricating a semiconductor circuit in accordance with Embodiment 6 of the invention.
Figure 9:
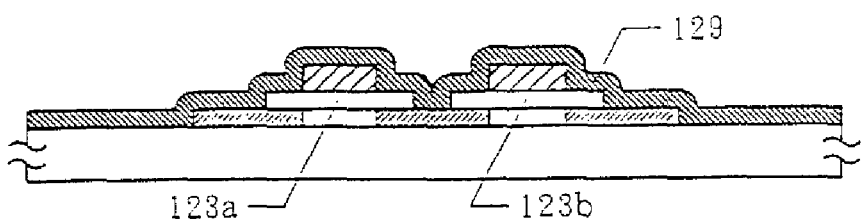
Figure 9:
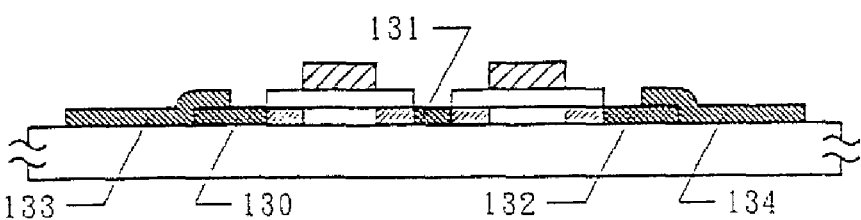
Figure 9:
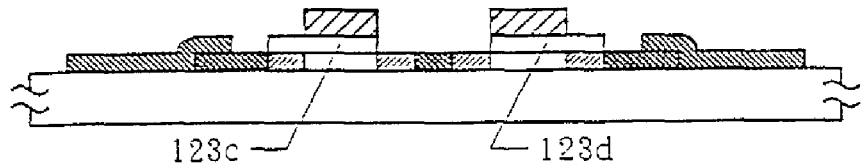
Figure 9:
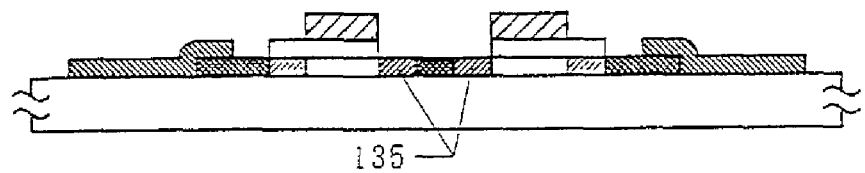

Then, a film of Ti (titanium) 129 is formed over the whole surface to a thickness of 3000 to 6000 Å by sputtering (FIG. 9(B)).

The Ti layer is reacted with the active layer of silicon by thermal annealing to form a silicide layer, 130-132, in the doped regions 126-128. Thereafter, the Ti film is selectively etched to form conductive interconnects 133 and 134 (FIG. 9(C)). Subsequently, those portions of the gate insulator film, 123a and 123b, which overlap the lightly doped region 127 are etched to produce etched portions 123c and 123d (FIG. 9(D)).

Then, phosphorus ions are again implanted as dopants by an ion implantation method to a high dopant concentration of $2\times10^{19}$ to $5\times10^{21}$ atoms/cm$^3$. In this way, a heavily doped region 135 is formed (FIG. 9(E)).

Figure 10:
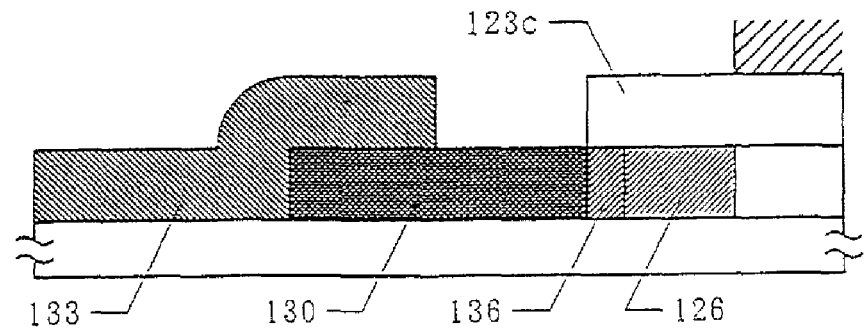
FIG. 10 is an enlarged cross section of a TFT in accordance with Embodiment 6 of the invention, conceptually illustrating the structure of the TFT.

The present embodiment is characterized in that the resistivity of the central doped region is reduced by the heavy doping, thus decreasing the series resistance. Although not seen from FIGS. 9(A)-9(E), a heavily doped region 136 is left between the silicide layer, 130 and 132, at both ends of the TFT and each lightly doped region, 126, 128, as shown in the enlarged view of FIG. 10. This structure is effective in reducing the electric field strength near the source and drain (FIG. 10).

In the present invention, a silicide layer is formed from a metallization layer in the source and drain in a self-aligned manner. This metallization layer is used for conductive interconnects or a contact pad to thereby reduce the circuit resistivity. Also, the circuit density can be enhanced. Especially, the present invention yields the following advantages: (1) No mask alignment problems take place; and (2) No problems occur in forming contacts. In this way, the invention can improve the characteristics of TFTs and semiconductor circuits, production yield, reliability, and productivity.

What is claimed is:

1. A method for fabricating a semiconductor device comprising:
    providing a crystalline silicon film over an insulating surface;
    forming a gate insulator layer over the crystalline silicon film;
    forming a gate electrode over the gate insulator layer;
    forming a source region and a drain region in a self-aligned manner using the gate electrode as a mask in the crystalline silicon film;
    forming a gate insulator film by etching the gate insulator layer so that-sidewalls of the gate electrode and the gate electrode overlaps the gate insulator film;
    forming a first metal layer over the gate electrode and in direct contact with the insulating surface, the source region, and the drain region;
    forming a silicide region in each of the source region and the drain region by reacting the crystalline silicon film with the first metal layer; and
    selectively etching the first metal layer so that a part of the first metal layer remains over the insulating surface.

2. The method for fabricating the semiconductor device according to claim 1, further comprising a step of:
    forming a second metal layer having a resistivity smaller than that of the first metal layer, so that the second metal layer is in direct contact with the first metal layer, before selectively etching the first metal layer.

3. The method for fabricating the semiconductor device according to claim 1, further comprising steps of:
    forming an interlayer dielectric over the first metal layer;
    forming a contact hole reaching the first metal layer; and
    forming a third metal layer connected to the first metal layer via the contact hole.

4. The method for fabricating the semiconductor device according to claim 1, wherein the first metal layer comprises titanium.

5. The method for fabricating the semiconductor device according to claim 1, wherein the insulating surface comprises a silicon oxide film.

6. The method for fabricating the semiconductor device according to claim 1, wherein the gate electrode comprises silicon.

7. A method for fabricating a semiconductor device comprising:
    providing a crystalline silicon film over an insulating surface;
    forming a gate insulator layer over the crystalline silicon film;
    forming a gate electrode over the gate insulator layer;
    forming a source region and a drain region in a self-aligned manner using the gate electrode as a mask in the crystalline silicon film;
    forming a gate insulator film by etching the gate insulator layer so that sidewalls of the gate electrode and the gate electrode overlaps the gate insulator film;
    forming a first metal layer over the gate electrode and in direct contact with the insulating surface, the gate electrode, the source region, and the drain region;
    forming a silicide region in each of the source region and the drain region by reacting the crystalline silicon film with the first metal layer; and
    selectively etching the first metal layer so that a part of the first metal layer remains over the insulating surface.

8. The method for fabricating the semiconductor device according to claim 7, further comprising a step of:
    forming a second metal layer having a resistivity smaller than that of the first metal layer, so that the second metal layer is in direct contact with the first metal layer, before selectively etching the first metal layer.

9. The method for fabricating the semiconductor device according to claim 7, further comprising steps of:
    forming an interlayer dielectric over the first metal layer;
    forming a contact hole reaching the first metal layer; and
    forming a third metal layer connected to the first metal layer via the contact hole.

10. The method for fabricating the semiconductor device according to claim 7, wherein the first metal layer comprises titanium.

11. The method for fabricating the semiconductor device according to claim 7, wherein the insulating surface comprises a silicon oxide film.

12. The method for fabricating the semiconductor device according to claim 7, wherein the gate electrode comprises silicon.

13. A method for fabricating a semiconductor device comprising:
    providing a crystalline silicon film over an insulating surface;
    forming a gate insulator layer over the crystalline silicon film;
    forming a gate electrode over the gate insulator layer;
    forming a source region and a drain region in a self-aligned manner using the gate electrode as a mask in the crystalline silicon film;
    forming a gate insulator film by etching the gate insulator layer so that sidewalls of the gate electrode and the gate electrode overlaps the gate insulator film;
    forming a first metal layer over the gate electrode and in direct contact with the insulating surface, the gate electrode, the source region, and the drain region;
    forming a silicide region in each of the source region, the drain region, and the gate electrode by reacting the crystalline silicon film with the first metal layer; and
    selectively etching the first metal layer so that a part of the first metal layer remains over the insulating surface.

14. The method for fabricating the semiconductor device according to claim 13, further comprising a step of:
    forming a second metal layer having a resistivity smaller than that of the first metal layer, so that the second metal layer is in direct contact with the first metal layer, before selectively etching the first metal layer.

15. The method for fabricating the semiconductor device according to claim 13, further comprising steps of:
    forming an interlayer dielectric over the first metal layer;
    forming a contact hole reaching the first metal layer; and
    forming a third metal layer connected to the first metal layer via the contact hole.

16. The method for fabricating the semiconductor device according to claim 13, wherein the first metal layer comprises titanium.

17. The method for fabricating the semiconductor device according to claim 13, wherein the insulating surface comprises a silicon oxide film.

18. A method for fabricating a semiconductor device comprising:

providing a crystalline silicon film over an insulating surface;

forming a gate insulator layer over the crystalline silicon film;

forming a gate electrode over the gate insulator layer;

forming a source region and a drain region in a self-aligned manner using the gate electrode as a mask in the crystalline silicon film;

forming a gate insulator film by etching the gate insulator layer so that-sidewalls of the gate electrode and the gate electrode overlaps the gate insulator film;

forming a first metal layer over the gate electrode and in direct contact with at least side surfaces of the source region and the drain region;

forming a silicide region in each of the source region and the drain region by reacting the crystalline silicon film with the first metal layer; and selectively etching the first metal layer so that a part of the first metal layer remains over the insulating surface.

19. The method for fabricating the semiconductor device according to claim 18, further comprising a step of:

forming a second metal layer having a resistivity smaller than that of the first metal layer, so that the second metal layer is in direct contact with the first metal layer, before selectively etching the first metal layer.

20. The method for fabricating the semiconductor device according to claim 18, further comprising steps of:

forming an interlayer dielectric over the first metal layer;

forming a contact hole reaching the first metal layer; and forming a third metal layer connected to the first metal layer via the contact hole.

21. The method for fabricating the semiconductor device according to claim 18, wherein the first metal layer comprises titanium.

22. The method for fabricating the semiconductor device according to claim 18, wherein the insulating surface comprises a silicon oxide film.

23. The method for fabricating the semiconductor device according to claim 18, wherein the gate electrode comprises silicon.

24. A method for fabricating a semiconductor device comprising:

providing a crystalline silicon film over an insulating surface;

forming a gate insulator layer over the crystalline silicon film;

forming a gate electrode over the gate insulator layer;

forming a source region and a drain region in a self-aligned manner using the gate electrode as a mask in the crystalline silicon film;

forming a gate insulator film by etching the gate insulator layer so that sidewalls of the gate electrode and the gate electrode overlaps the gate insulator film;

forming a first metal layer over the gate electrode and in direct contact with the gate electrode and at least side surfaces of the source region and the drain region;

forming a silicide region in each of the source region and the drain region by reacting the crystalline silicon film with the first metal layer; and selectively etching the first metal layer so that a part of the first metal layer remains over the insulating surface.

25. The method for fabricating the semiconductor device according to claim 24, further comprising a step of:

forming a second metal layer having a resistivity smaller than that of the first metal layer, so that the second metal layer is in direct contact with the first metal layer, before selectively etching the first metal layer.

26. The method for fabricating the semiconductor device according to claim 24, further comprising steps of:

forming an interlayer dielectric over the first metal layer;

forming a contact hole reaching the first metal layer; and forming a third metal layer connected to the first metal layer via the contact hole.

27. The method for fabricating the semiconductor device according to claim 24, wherein the first metal layer comprises titanium.

28. The method for fabricating the semiconductor device according to claim 24, wherein the insulating surface comprises a silicon oxide film.

29. The method for fabricating the semiconductor device according to claim 24, wherein the gate electrode comprises silicon.

30. The method for fabricating the semiconductor device according to claim 24, wherein a silicide region is formed in the gate electrode.

* * * * *